(12) United States Patent
Zheng et al.

(10) Patent No.: US 11,522,735 B1
(45) Date of Patent: Dec. 6, 2022

(54) DIGITAL NOISE-SHAPING FFE/DFE FOR ADC-BASED WIRELINE LINKS

(71) Applicant: Xilinx, Inc., San Jose, CA (US)

(72) Inventors: Kevin Zheng, San Jose, CA (US); Hongtao Zhang, San Jose, CA (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 217 days.

(21) Appl. No.: 16/998,864

(22) Filed: Aug. 20, 2020

(51) Int. Cl.
*H04L 25/03* (2006.01)
*H03H 21/00* (2006.01)

(52) U.S. Cl.
CPC .. *H04L 25/03057* (2013.01); *H04L 25/03949* (2013.01); *H03H 21/0043* (2013.01); *H03H 21/0067* (2013.01)

(58) Field of Classification Search
CPC ........ H04L 25/03057; H04L 25/03949; H03H 21/0043; H03H 21/0067; H04B 1/1027; H04B 1/123
USPC ......................................................... 375/233
See application file for complete search history.

(56) References Cited

U.S. PATENT DOCUMENTS

| | | | |
|---|---|---|---|
| 8,976,854 B1 * | 3/2015 | Healey | H04L 25/03038 375/232 |
| 2004/0091071 A1 * | 5/2004 | Lin | H04L 25/03038 375/350 |

OTHER PUBLICATIONS

Schober. Signal Detection and Estimation: 6 Equalization of Channels with ISI. pp. 244-304, 61 pages.
Ali,Tamer; et al., A 460mW 112Gbps DSP-Based Transceiver with 38dB Loss Compensation for Next Generation Data Centers in 7nm FinFET technology, Mediatek, IEEE International Solid-State Circuits Conference, 2020, 32 pages.
Zhou, Honghang, et al., Recent Advances in Equalization Technologies for Short-Reach Optical Links Based on PAM4 Modulation: A Review., applied sciences, MDPI, Appl. Sci. 2019, 9, 2342, 22 pages. doi:10.3390/app9112342.

* cited by examiner

*Primary Examiner* — Leila Malek
(74) *Attorney, Agent, or Firm* — Patterson + Sheridan, LLP

(57) ABSTRACT

Apparatus and associated methods relate to an ADC-based digital receiver including a feedforward equalizer (FFE) that has m precursor taps and n postcursor taps to equalize the precursor portion, and to adapt postcursor intersymbol interference (ISI) through a predetermined equalization coefficient selected to counteract the noise boosting effect associated with the precursor equalization. In an illustrative example, the receiver may dynamically balance noise and ISI through adaptively determining a coefficient $hp_1$ of a first postcursor tap of a first FFE and a coefficient $h_1$ of a first postcursor tap of a second equalizer adapted to substantially reduce or eliminate additional ISI introduced by the first FFE. The first FFE may optimize ISI removal and noise reduction, for example. One of the coefficients $h_1$ and $hp_1$ may be predetermined, and then the other coefficient may be iteratively adapted to trade off precursor ISI and postcursor ISI to minimize BER.

20 Claims, 11 Drawing Sheets

DIGITAL NOISE-SHAPING FFE/DFE FOR ADC-BASED WIRELINE LINKS

TECHNICAL FIELD

Various embodiments relate generally to integrated circuits, and more specifically, to digital receiver circuits.

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information between two or more points that are not connected by an electrical conductor. Wireless data links may transport data by using electromagnetic waves propagating through a medium, such as air or free space.

At a receiver in a digital communication system, a digitally-encoded data stream may be received as an analog signal and converted to a digital format by an analog-to-digital converter (ADC). The output of the ADC may be a digital signal that may include components of noise and intersymbol interference (ISI).

SUMMARY

Apparatus and associated methods relate to an ADC-based digital receiver including a feedforward equalizer (FFE) that has m precursor taps and n postcursor taps to equalize the precursor portion, and to adapt postcursor inter-symbol interference (ISI) through a predetermined equalization coefficient selected to counteract the noise boosting effect associated with the precursor equalization. In an illustrative example, the receiver may dynamically balance noise and ISI through adaptively determining a coefficient $hp_1$ of a first postcursor tap of a first FFE and a coefficient $h_1$ of a first postcursor tap of a second equalizer adapted to substantially reduce or eliminate additional ISI introduced by the first FFE. The first FFE may optimize ISI removal and noise reduction, for example. One of the coefficients $h_1$ and $hp_1$ may be predetermined, and then the other coefficient may be iteratively adapted, to trade off precursor ISI and postcursor ISI to minimize BER.

Various embodiments may achieve one or more advantages. For example, some embodiments using the digital receiver in a four-level pulse amplitude modulation (PAM4) circuit increase system performance by reducing signal BER without significantly increasing implementation or operation cost. In some embodiments conditioning a digital signal with a first FFE having first postcursor tap coefficient $hp_1 \neq 0$, noise-shaping may be efficiently achieved to control noise boosting of the FFE without unduly penalizing ISI, thereby creating "whiter" noise before a slicer. In some embodiments, conditioning a digital signal with a first FFE having first postcursor tap coefficient $hp_1 \neq 0$, followed by a second FFE and a DFE having first postcursor tap coefficient of $h_1 \neq 0$, the channel may be fully equalized by the first FFE, noise-shaped by the second FFE, and ISI removed by the DFE. In some embodiments, slicers used only during startup may be reused in evaluating a signal quality characteristic, thereby reducing implementation cost. In some examples, the second equalizer may further improve signal integrity by including a second FFE in cascade connection between the first FFE and the DFE, and may be provided with a first postcursor tap having coefficient $h_1$. Various implementations may improve high-speed communication systems that use an ADC-based receiver in, for example, optical, networking, or communication applications.

In one exemplary aspect, a receiver adaptation circuit may include: an analog-to-digital-converter (ADC) configured to receive an incoming data signal via a communication link and convert it to a digital signal; a processor coupled to receive the digital signal and process the digital signal to generate an equalized output signal; a data store coupled to the processor and containing a program of instructions that, when executed by the processor, cause operations to be performed to reduce bit error rate (BER) in a digital signal by dynamically balancing received signal noise and intersymbol interference (ISI), the operations including: processing the digital signal by a first forward feedback equalizer (FFE) provided with m precursor taps and n postcursor taps and having a coefficient hp1 at a first postcursor tap of the first FFE; processing an output of the first FFE by a second equalizer having a coefficient h1 at a post-cursor tap of the second equalizer to generate an equalized output signal; selecting one coefficient of hp1 and h1 to be preset; and performing presetting operations on the selected coefficient. The presetting operations may include: setting the selected coefficient to a predetermined value, and saving the value of the selected coefficient in a first data store. The operations to reduce BER may further include adapting the unselected coefficient by performing adaptation operations. The adaptation operations may include: evaluating at least one signal quality characteristic of an equalized output signal; using the at least one characteristic to set a value for the unselected coefficient; and, saving the value of the unselected coefficient in a second data store.

The circuit may be further configured such that the second equalizer may include a decision feedback equalizer (DFE) provided with a first postcursor tap having the coefficient h1 thereat, and the at least one signal quality characteristic includes a measure of signal-to-noise ratio (SNR) as a metric of BER.

In another exemplary aspect, a receiver calibration circuit may include: a processor; and a data store coupled to the processor and containing a program of instructions that, when executed by the processor, cause operations to be performed to calibrate coefficients for taps of two cascade-connected digital equalizers. The operations may include: processing the digital signal by a first forward feedback equalizer (FFE) provided with m precursor taps and n postcursor taps and having a coefficient hp1 at a first postcursor tap of the first FFE; processing an output of the first FFE by a second equalizer having a coefficient h1 at a post-cursor tap of the second equalizer to generate an equalized output signal; selecting one coefficient of hp1 and h1 to be preset; and performing presetting operations on the selected coefficient. The presetting operations may include: setting the selected coefficient to a predetermined value; and, saving the value of the selected coefficient in a first data store. The operations to calibrate coefficients may further include adapting the unselected coefficient by performing adaptation operations. The adaptation operations may include: evaluating at least one signal quality characteristic of an equalized output signal; using the at least one characteristic to set a value for the unselected coefficient; and, saving the value of the unselected coefficient in a second data store.

The circuit may be configured where the second equalizer includes a decision feedback equalizer (DFE) provided with a first postcursor tap having the coefficient h1 thereat, and the at least one signal quality characteristic comprises a measure of signal-to-noise ratio (SNR) as a metric of BER.

In another exemplary aspect, a method, to reduce bit error rate (BER) in a digital signal by dynamically balancing received signal noise and intersymbol interference (ISI), may include: processing a digital signal by a first forward feedback equalizer (FFE) provided with m pre-cursor taps and n post-cursor taps, having a coefficient hp1 at a first post-cursor tap of the first FFE; processing an output of the first FFE by a second equalizer having a coefficient h1 at a post-cursor tap of the second equalizer to generate an equalized output signal; selecting one coefficient of hp1 and h1 to be preset; and performing presetting operations on the selected coefficient. The presetting operations may include: setting the selected coefficient to a predetermined value; and saving the value of the selected coefficient in a first data store. The method may further include adapting the unselected coefficient by performing adaptation operations. The adaptation operations may include: evaluating at least one signal quality characteristic of the equalized output signal; using the at least one characteristic to set a value for the unselected coefficient; and, saving the value of the unselected coefficient in a second data store.

The second equalizer may include a decision feedback equalizer (DFE). The DFE may be a single tap DFE, and h1 may be a coefficient of the single tap. The DFE may be a multi-tap DFE, and h1 may be a coefficient of a first postcursor tap thereof. The second equalizer may further include a second FFE connected in cascade between the first FFE and the DFE, the second FFE may be provided with a single postcursor tap having the coefficient h1 thereat, and the DFE may be provided with at least one postcursor tap having the coefficient h1 thereat.

Additional coefficients of the first FFE taps may include precursor taps $hm_m$, $hm_m+1$, ... $hm_1$ and postcursor taps other than the first postcursor tap $hp_2$ ... $hp_n$, and the additional coefficients may be adapted by additional adaptation operations. The method may be further configured where the additional adaptation operations include a least mean squares (LMS) coefficient adaptation method.

The first data store and the second data store may be disposed on a single data storage device. The selected coefficient may be h1. The selected coefficient may be hp1. The method may be configured where setting a value for the unselected coefficient includes selecting a value from a lookup table based on a measured value of the at least one characteristic. The method may be further configured where the value selected from the lookup table is also selected based on a ratio between h1 and hp1.

The method may further include performing iterative adaptation of the selected coefficient, the iterative adaptation operations including: evaluating at least one predetermined metric of BER, evaluating if BER is minimized using the predetermined metric, varying the current value of the selected coefficient, saving the current value of the selected coefficient in the first data store, and repeating the adapting operations on the unselected coefficient. The method may be further configured where varying the current value is conducted according to at least one of a random walk and a gradient descent process. The method may be further configured where at least some of the adaptation operations are controlled by a microcontroller, and the predetermined metric of BER includes signal-to-noise ratio (SNR) measured by an SNR estimator.

The method may be configured where the signal quality characteristic includes a predetermined metric of BER. The method may be further configured where the predetermined metric of BER is signal-to-noise ratio (SNR) measured at an output of the second equalizer.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to optimizing bit error rate (BER) of an output signal of an ADC-based digital receiver by dynamically balancing received signal noise and ISI through adaptively determining a coefficient $hp_1$ of a first postcursor tap of a first feed forward equalizer (FFE) and a coefficient $h_1$ of a first postcursor tap of a second equalizer operably connected to an output of the first FFE. In an illustrative example the first FFE is provided with m precursor taps and n postcursor taps, and is adapted to equalize the precursor portion, and various embodiments are further configured to add postcursor ISI through a predetermined equalization coefficient (e.g., hp1) in order to counteract the noise boosting effect associated with the precursor equalization. In an illustrative example, the second equalizer comprises a decision feedback equalizer (DFE) and slicers adapted to eliminate additional ISI introduced by the first FFE. In an illustrative example, the second equalizer further comprises a second FFE in cascade connection between the first FFE and the DFE, and is provided with a first postcursor tap having coefficient $h_1$. In an illustrative example, one coefficient of $h_1$ and $hp_1$ is selected to be predetermined, and the unselected coefficient is adapted to minimize a metric of BER. In an illustrative example, one of $h_1$ or $hp_1$ is iteratively adapted to minimize SNR as a metric of BER, as measured by an SNR estimator. Thus, better overall system performance due to decreased BER by balancing noise and ISI may be achieved.

To aid understanding, this document is organized as follows. First, an exemplary platform (e.g., a field programmable gate array FPGA) suitable to perform data communication is briefly introduced with reference to FIG. 1. Second, with reference to FIGS. 2-4, the discussion turns to exemplary embodiments that illustrate schematics of a tuneable DSP in a receiver having a first FFE and second equalizer. Third, with reference to FIGS. 5-7, exemplary simulation results are discussed that show responses of various implementations to tuning coefficients $h_1$ and $hp_1$, as well as affects of various configurations and methods on BER. Then, with reference to FIGS. 8-9, exemplary methods to configure the DSP by tuning $h_1$ and $hp_1$ are shown. Finally, with reference to FIG. 10, another exemplary platform (e.g., a system-on-Chip (SOC)) suitable to perform data communication and DSP is briefly introduced.

Figure 1:
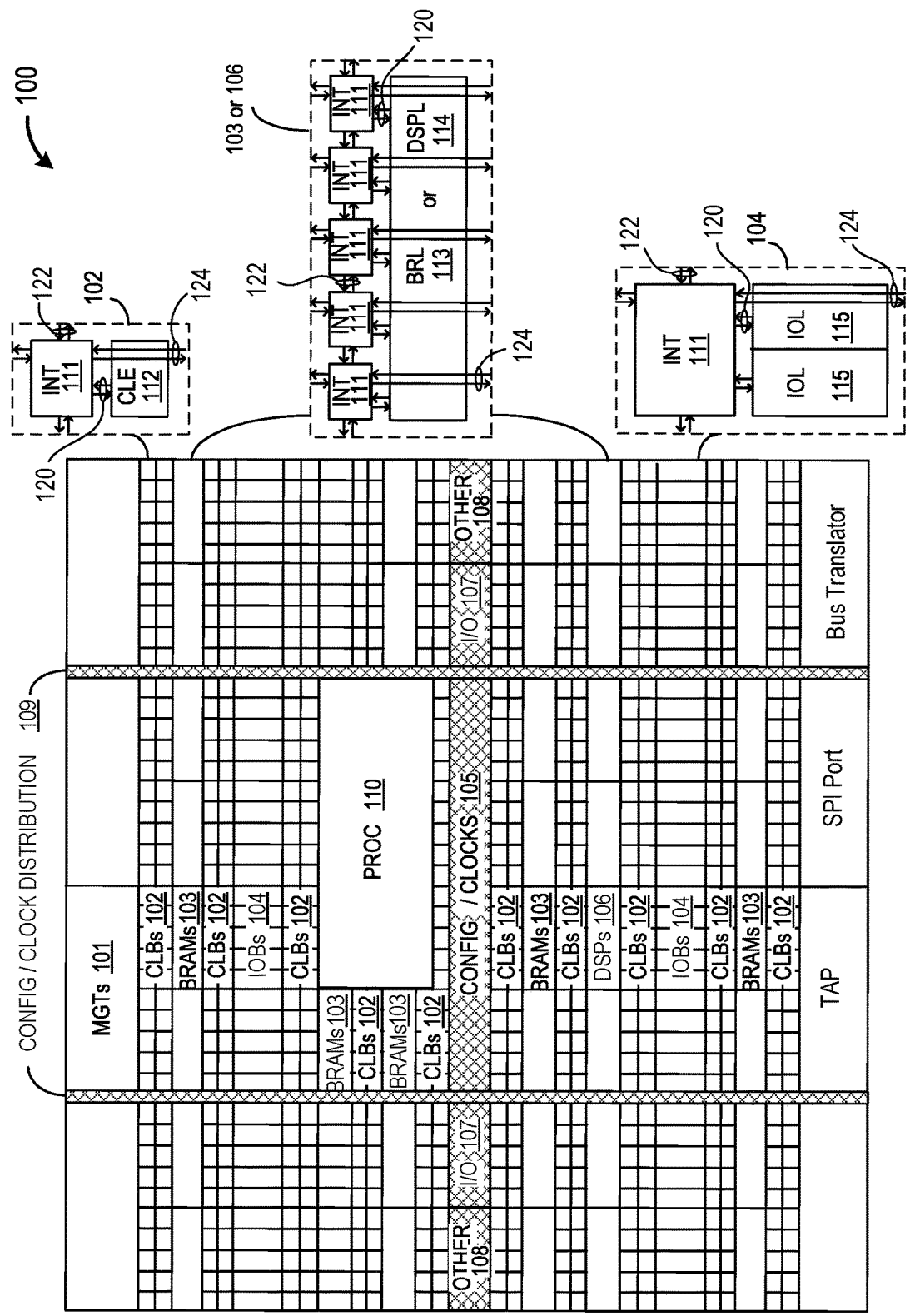
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Integrated circuits (IC) (e.g., FPGA), such as the programmable IC 100, for example, may be used in a communication system to support various data communication protocols over wide frequency ranges while using progressively smaller areas. In various examples, analog signal levels may be converted into digital voltages, digital currents or digital charge signals using an analog-to-digital converter (ADC). Inter-symbol interference (ISI) is a form of distortion of a signal in which one symbol interferes with prior and/or subsequent symbols. When the ADC is implemented in a receiver and includes a time-interleaved (TI)-ADC, ISI may be introduced due to, for example, finite bandwidth, and/or or non-optimal frequency response of analog circuitry (e.g., track-and-hold circuits) inside a sampling front-end (SFE) circuit of the time-interleaved ADC. The presence of ISI may introduce errors at the receiver's output. Thus, the architecture of the ADC-based receiver may be further improved to minimize the effects of ISI, and thereby deliver the digital data to its destination with a reduced error rate.

Figure 2:
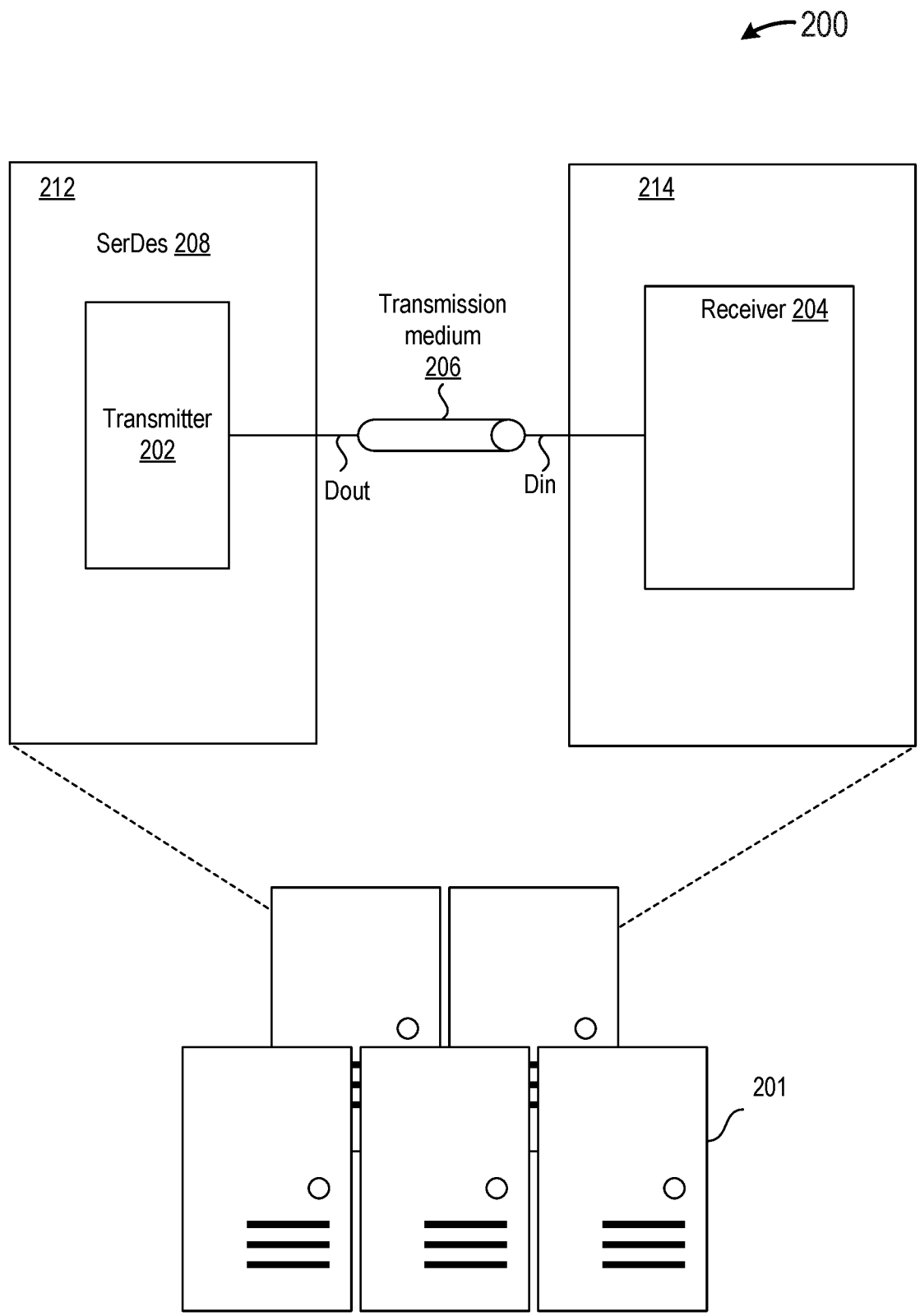
FIG. 2 depicts an exemplary receiver having an exemplary digital signal processing system (DSP) implemented in an exemplary communication system.

FIG. 2 depicts an exemplary receiver having an exemplary digital signal processing system (DSP) implemented in an exemplary communication system. In this depicted example, an exemplary communication system 200 between servers 201 includes a transmitter 202 configured to transmit data $D_{out}$ to a receiver 204 over transmission medium 206. In some embodiments, the receiver 204 may be an ADC-based receiver. The receiver 204 may advantageously minimize the effects of inter-symbol interference ISI, and thereby deliver the digital data to its destination with a reduced error rate by providing a digital signal processing system (DSP) having a first feed forward equalizer (FFE) and second equalizer with taps with predetermined locations to mitigate ISI introduced by, for example, a sampling front-end circuit of the ADC.

The transmission medium 206 may degrade the signal quality of the transmitted signal $D_{out}$. The data signal received by the receiver 204 may be defined as $D_{in}$. The received data $D_{in}$ may require reconstruction (equalization) before use.

The transmitter 202 may be part of a serializer-deserializer (SerDes) 208. The receiver 204 may also be part of a SerDes. The transmission medium 206 may include printed circuit board (PCB) traces, vias, cables, connectors, decoupling capacitors, and the like. In some embodiments, the SerDes 208 may be disposed in an integrated circuit (IC) 212, and the receiving SerDes may be disposed in an IC 214.

The transmitter 202 drives serial data onto the transmission medium 206 using, for example, a digital baseband modulation technique. In general, the serial data is divided into symbols. The transmitter 202 converts each symbol into an analog voltage mapped to the symbol. The transmitter 202 couples the analog voltage generated from each symbol to the transmission medium 206. In some embodiments, the transmitter 202 may use a binary non-return-to-zero (NRZ) modulation scheme. In binary NRZ, a symbol may be one bit of the serial data and two analog voltages may be used to represent each bit. In some examples, the transmitter 202 may use multi-level digital baseband modulation techniques, such as pulse amplitude modulation (PAM), where a symbol includes two or more bits of the serial data and more than two analog voltages may be used to represent each bit. The transmitter 202 may specifically use 4-level PAM (PAM4).

The receiver 204 may include a digital signal processing system (DSP) operable to equalize the digital signal to optimize the system performance by, for example, reducing bit error rate (BER). Optimization of system performance may advantageously be achieved through digital noise-shaping using a FFE in cascade connection with one or more subsequent equalizers. Digital noise-shaping may be used to provide an adaptable tradeoff between post-cursor inter-symbol interference (ISI) and signal noise to minimize BER.

Figure 3A:
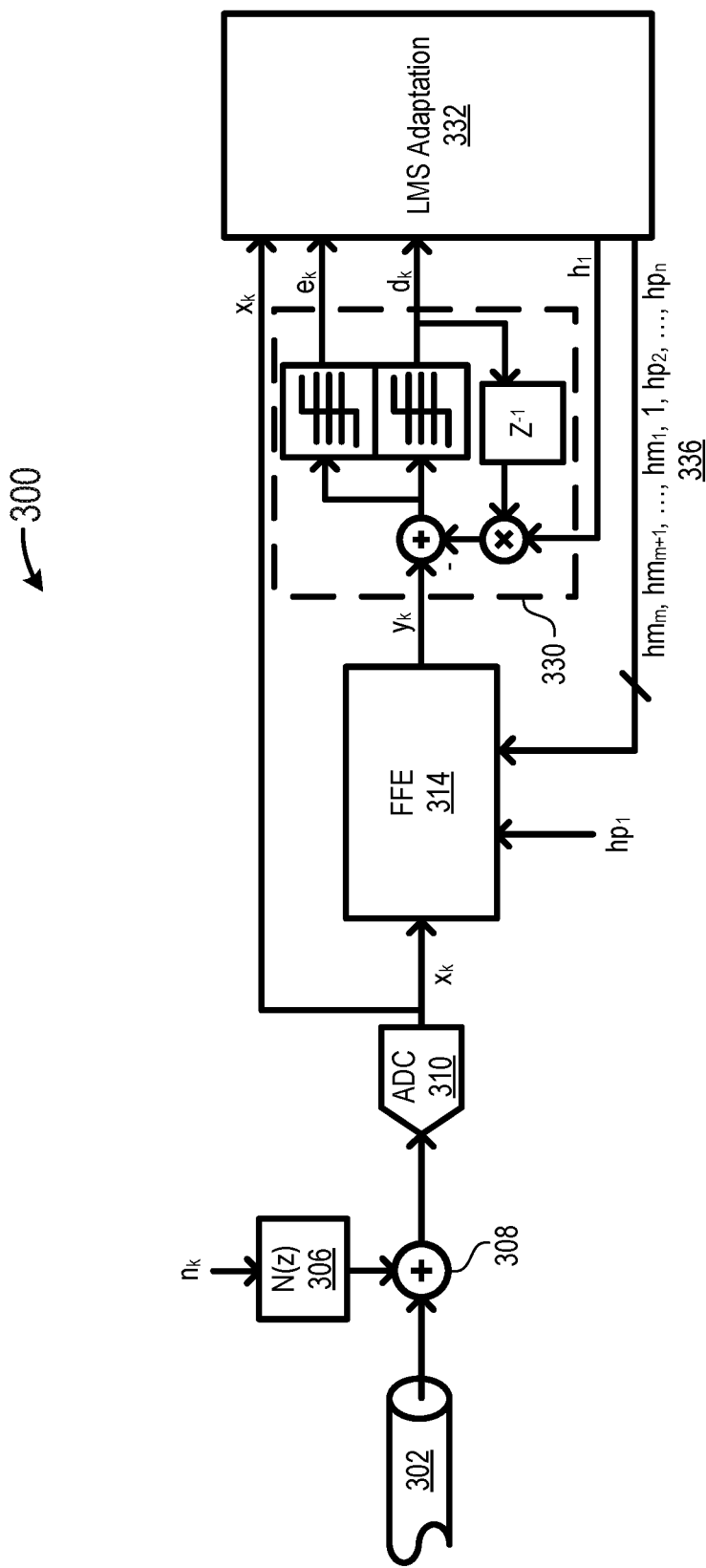
FIG. 3A depicts a block diagram of an exemplary receiver, and an exemplary first FFE and DFE implemented in the exemplary receiver, having first postcursor tap coefficients $hp_1$ and $h_1$, respectively.

FIG. 3A depicts a block diagram of a second exemplary analog-to-digital-converter (ADC) based receiver 300 in a high-speed communication link, which may be used for PAM4 applications at, for example, greater than 56 gigabits per second (Gbps). An incoming data signal received from communication link 302 is processed through summing circuit 308 to condition the signal with the output of a coloring filter N(z) 306 applying noise signal $n_k$. Noise signal $n_k$ processed by the coloring filter N(z) 306 may mimic frequency response of one or more crosstalk channels, or power spectral density (PSD) of one or more analog front end (AFE) signal conditioning circuits. A receiver circuit configured to advantageously condition colored noise may be particularly important, as crosstalk may be fully colored, for example, by a continuous linear time equalizer (CTLE). Crosstalk noise may be colored in nature due to the finite impulse response (TX FIR) of the aggressor signal(s) and the high-pass nature of some coupling transfer functions. In full duplex systems, residual echo may also be colored due to the TX FIR and mismatch between main and replica channels at high frequency. Accordingly, with colored noise, additional benefits from noise-shaping may be realized and enhancing the results of optimized reduction of BER by dynamically balancing received signal noise and ISI.

The conditioned output signal from summing circuit 308 is converted into a digital signal by ADC 310. The resulting digital signal $x_k$ is passed into first FFE 314, having m precursor taps and n postcursor taps. First FFE postcursor tap coefficient hp1 is individually determined, while the remaining m precursor tap coefficients and n−1 postcursor tap coefficients 336, $hm_m$, $hm_{m+1}$, ..., $hm_1$, $hp_2$, ..., $hp_n$, are determined by least mean squares (LMS) adaptation circuit 332. FFE 314 equalizes the digital signal according to hp1 and coefficients 336. The FFE 314 may advantageously equalize precursor ISI, and may also equalize other residual ISIs. The FFE 314 may utilize hp1 as a tuning coefficient to achieve desired tradeoff between noise amplification and ISI cancellation for better overall system performance. A positive value for hp1 may be used to reduce high frequency noise peaking, effectively shifting precursor ISI into the postcursor region, and translating to minimal noise amplification in the frequency domain. The noise and resulting additional postcursor ISI may be conditioned with one or more subsequent equalizers.

In the exemplary receiver 300 in FIG. 3A, a noise-shaped signal $y_k$ is passed to decision feedback equalizer (DFE) 330 at least for conditioning of the postcursor ISI. DFE 330 comprises slicers and filter $Z^{-1}$, and generates sliced error output $e_k$ and sliced data output signal $d_k$. DFE 330 is a single-tap DFE with coefficient h1, configured to focus solely on the first post-cursor; however, multiple-tap DFEs may be used. Least mean square (LMS) adaptation circuit 332 accepts original digital signal $x_k$, and DFE output signals $e_k$ and $d_k$, and generates coefficients h1 for DFE 330 and coefficients 336 for FFE 314, excluding first post-cursor tap coefficient hp1.

Figure 3B:
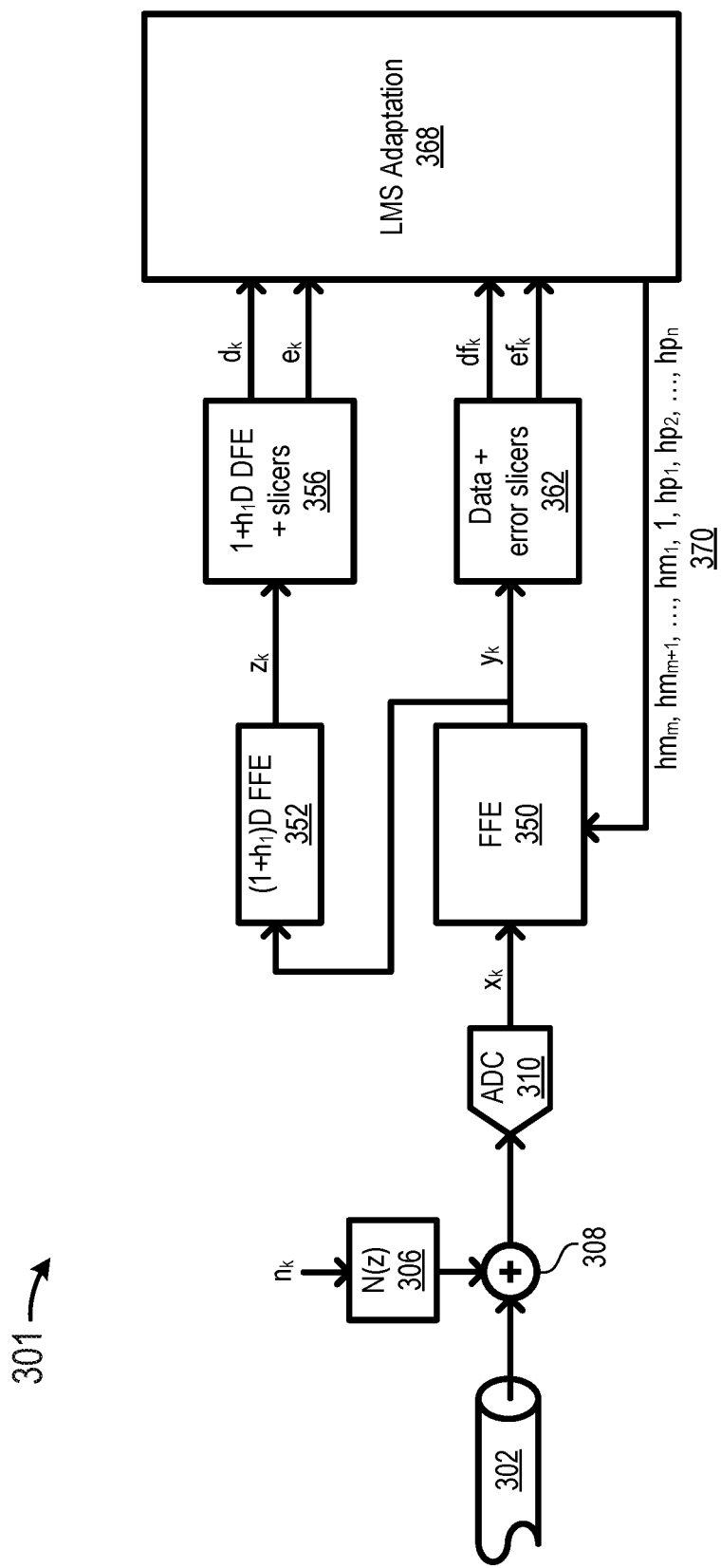
FIG. 3B depicts a block diagram of an exemplary receiver, and an exemplary first FFE, second FFE, and DFE implemented in the exemplary receiver, having first post-cursor tap coefficients $hp_1$, $h_1$, and $h_1$, respectively.

FIG. 3B depicts a block diagram of an exemplary analog-to-digital-converter (ADC) based receiver 301 in a high-speed communication link, which may be used for PAM4 applications at greater than 56 gigabits per second (Gbps). An incoming data signal received from communication link 302 is processed through summing circuit 308 to condition the signal with the output of a coloring filter 306 applying noise signal $n_k$.

The conditioned output signal from summing circuit 308 is converted into a digital signal by ADC 310. The resulting digital signal $x_k$ is passed into first FFE 350, having m precursor taps and n postcursor taps. First FFE m precursor tap coefficients and n postcursor tap coefficients 370, $hm_m$, $hm_{m+1}$, ..., $hm_1$, $hp_1$, $hp_2$, ..., $hp_n$, are determined by least mean squares (LMS) adaptation circuit 368. FFE 350 equalizes the digital signal according to coefficients 370. Coefficients 370 for FFE 350 may be chosen to maximize inversion of the channel $x_k$, causing FFE 350 to generate output $y_k$ such that it approximates a perfect channel with significant noise, which may be sufficiently eliminated by DFE 330. The first FFE 350 may thus operate to fully equalize the channel. Conditioning of subsequent equalizers second FFE 352 and DFE 356, including sufficient elimination of noise in FFE 314 output signal $y_k$, may be at least partially controlled by coefficient h1 to optimize reduction in bit BER in the digital signal by dynamically balancing received signal noise and ISI.

FFE 350 output $y_k$ is conditioned by second FFE 352, generating output $z_k$. DFE 356 subsequently conditions and slices output $z_k$, generating first data stream $d_k$ and first error stream $e_k$. In parallel to second FFE 352 and DFE 356, FFE 350 output $y_k$ is processed by data and error slicers 362, which generates second data stream $df_k$ and second error stream $ef_k$. LMS adaptation circuit 368 receives data streams $d_k$ and $df_k$ and error streams $e_k$ and $ef_k$.

Second FFE 352 may be configured as a noise prediction filter, represented in general by 1+P(z), where P(z) is a prediction function. In the depicted example, the second FFE is a single-tap FFE configured as a simplified prediction filter represented by (1+h1)×D, where D is the signal received by the FFE. Similarly, DFE 356 is a single tap DFE multiplying coefficient (1+h1) with input signal D, which is $z_k$ in the illustrated example. The coefficient h1 is predetermined, and may be used as a tuning coefficient to achieve desired tradeoff between noise amplification and ISI cancellation for better overall system performance. FFE 350 first post-cursor coefficient hp1 is adaptively determined by LMS adaptation 368. In some embodiments, hp1 may be predetermined, and h1 adaptively determined, for example, by LMS adaptation 368.

Figure 4:
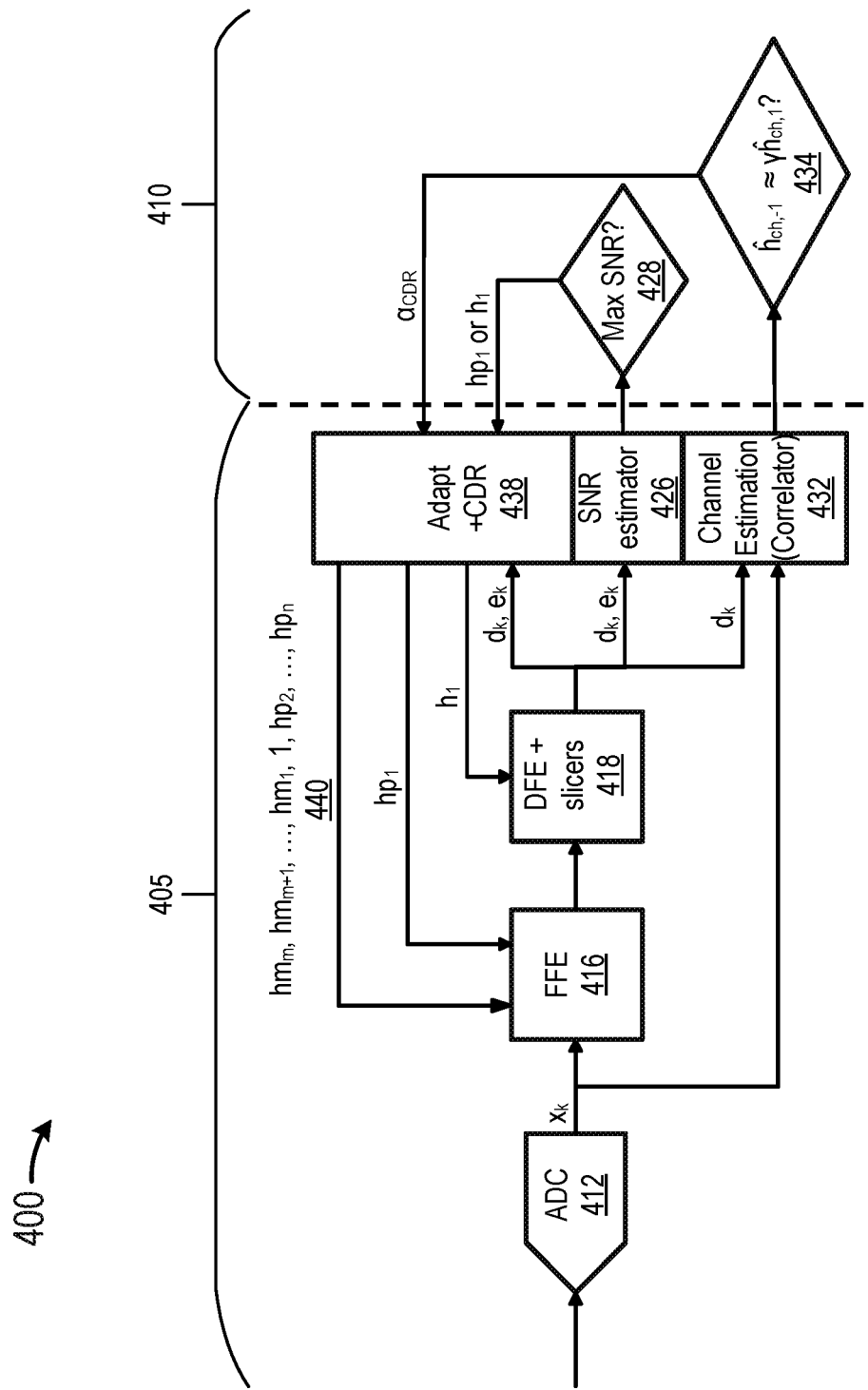
FIG. 4 depicts a block diagram of an exemplary receiver, and an exemplary first FFE and DFE implemented in the exemplary receiver, and an exemplary loop implemented to iteratively adapt one of FFE first postcursor tap coefficient $hp_1$ and DFE first postcursor tap coefficient $h_1$.

FIG. 4 depicts a block diagram of an exemplary adaptive receiver circuit 400 comprising an ADC-based receiver circuit 405 provided with dual-loop coefficient adaptation circuit 410 utilizing signal-to-noise ratio (SNR) as a metric of BER to determine an appropriate first postcursor coefficient for an FFE or DFE. In various embodiments, the coefficient adaptation circuit may be at least partially on-chip, may be at least partially off-chip, and may comprise a processor(s) executing program instructions from a data store(s).

Receiver circuit 405 comprises ADC 412, which converts an incoming signal into digital signal $x_k$. Subsequently, FFE 416 receives digital signal $x_k$. FFE 416 is provided with m precursor taps and n postcursor taps, with m precursor tap coefficients and n−1 postcursor tap coefficients 440, $hm_m$, $hm_{m+1}$, ..., $hm_1$, $hp_1$, $hp_2$, ... $hp_n$. The coefficients 440 are determined by combination clock and data recovery (CDR) and adaptation circuit 438, and may operate to effectively shift precursor ISI into the postcursor region and allow noise and resulting additional postcursor ISI to be conditioned with one or more subsequent equalizers. DFE 418, comprising digital signal slicers, receives as input the output signal from FFE 416 and produces data stream $d_k$ and error stream $e_k$. System performance and reduction in BER may be optimized by balancing a tradeoff between reducing signal noise and ISI by selecting one coefficient of $h_1$ or $hp_1$ to be predetermined, and dynamically determining the other coefficient $h_1$ or $hp_1$ using coefficient adaptation circuit 410.

The depicted example may allow h1 or hp1 to be adaptively set using a much slower loop than a main signal processing loop. Simulation shows that SNR at the DFE 418 slicer input may be a good proxy for the system's true BER performance. Specifically higher SNR may be correlated to lower BER. Accordingly, as depicted in FIG. 4A, the data stream $d_k$ and error stream $e_k$ are used by SNR estimator 426 to determine the SNR of the conditioned signal. The calculated SNR is used by coefficient adaptation circuit 410 in step 428 to evaluate whether a maximum SNR has been met, and the result returned to adaptation circuit 438. A desired value for coefficient $h_1$ or $hp_1$ may thus be determined, using SNR as a metric of BER, to achieve optimal system performance by, for example, random walk or gradient descent. The selected coefficient ($h_1$ or $hp_1$) may be repeatedly adjusted slightly and the resulting SNR measured and compared to estimate a change of direction of SNR. Once a maximum SNR has been achieved, the value associated therewith may be selected as corresponding to a minimized BER and, thus, an optimized system, and the value of the selected coefficient set accordingly.

Additionally, the exemplary embodiment depicted in FIG. 4 illustrates correlator assistance of the noise-shaping FFE and DFE. Decoupling of the CDR from the $h_1$ or $hp_1$ adaptation loop is achieved using an optional channel estimator to avoid potential convergence issues. Channel estimator 432 receives raw digital signal $x_k$ and sliced data stream $d_k$, and outputs an estimated channel ISI at a first precursor location ($\hat{h}_{ch,1}$), which is multiplied with scaling factor γ and compared 434 in channel coefficient adaptation circuit 410 to an estimated channel ISI at a first postcursor location ($\hat{h}_{ch,-1}$), and CDR locking condition coefficient $\alpha_{CDR}$ is determined thereby. CDR circuit 438 may employ coefficient $\alpha_{CDR}$ in determining the clock locking condition. The CDR locking condition coefficient may, thus, be adapted in a separate adaptation loop from the $h_1$ or $hp_1$ adaptation loop. The CDR locking condition coefficient may also be decoupled from other adaptation loops.

Figure 5A:
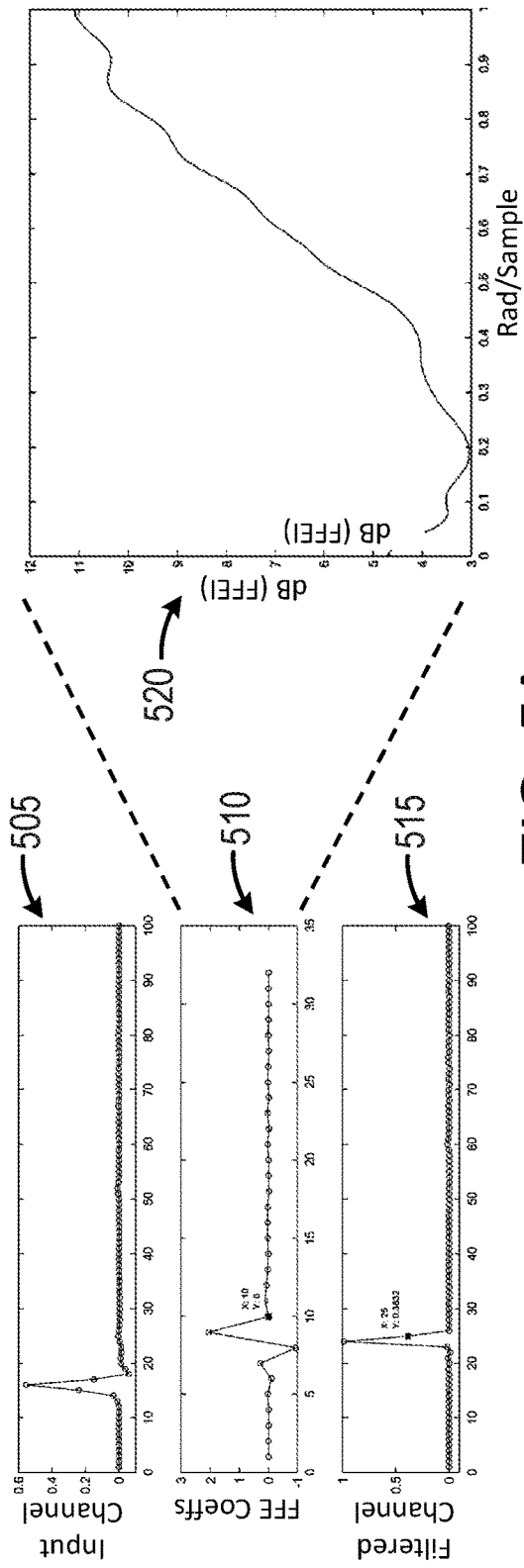
FIG. 5A depicts exemplary results of simulation of an exemplary receiver signal response where $hp_1$ is predetermined at 0 and $h_1$ is adapted.
Figure 5B:
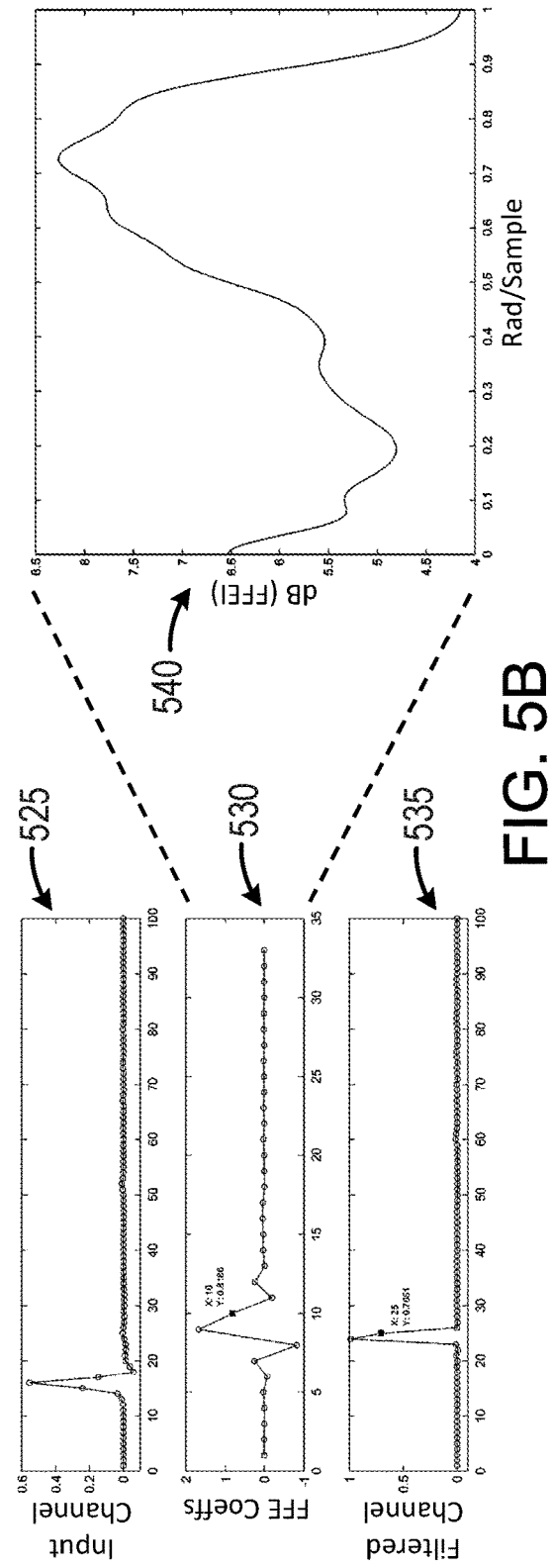
FIG. 5B depicts exemplary results of simulation of an exemplary receiver signal response where $h_1$ is predetermined and $hp_1$ is adapted.

FIGS. 5A-5B depict exemplary results of simulations of exemplary embodiments functionally similar to that shown in FIG. 3A. In FIG. 5A, a first postcursor tap coefficient $hp_1$ of a first n+m tap FFE, correlating to FFE 314 of FIG. 3A, is predetermined at 0, and $h_1$ of a single-tap DFE, correlating to DFE 330 of FIG. 3A, is allowed to be adaptively determined. In the simulation, $h_1$ adapted to approximately 0.38. The exemplary input and results are shown. Input channel 505 is displayed as normalized amplitude (between 0 and 1) vs time, which may be expressed as UI (unit interval) or in terms of a sample offset. FFE coefficients 510 are displayed as unitless factor (between −1 and 1) vs time. The resulting filtered channel 515 is displayed as normalized amplitude (between 0 and 1) vs time. Resultant FFE frequency response 520, shown in dB vs normalized frequency (radians/sample), shows a very strong high-pass signature, with approximately a 6 decibel (dB) boost from 0 hertz (Hz) to the Nyquist frequency. White noise input to this FFE experiences an integrated noise gain of approximately 2.3.

In FIG. 5B, the DFE single-tap coefficient $h_1$ is set to a predetermined value of 0.7, and FFE first postcursor tap coefficient $hp_1$ is allowed to be adaptively determined. Similarly to FIG. 5A, results from the input channel 525, FFE coefficients 530, and the resulting filtered channel 535 are displayed. The resultant FFE frequency response 540 reveals that the converged transfer function of the FFE appears 'flatter,' with a gain variation of less than 2 dB from 0 Hz. Thus, the transfer function when $hp_1$ is allowed to adapt instead of being forced to 0 is much "whiter," and the integrated noise gain experienced would be approximately 2.1. Therefore, FIG. 5B illustrates an SNR gain of approximately 1 dB. Such noise-shaping may be further amplified if the input noise to the first FFE (which may be considered a noise-shaping FFE when $hp_1 \neq 0$) is colored, having higher noise energy in a higher frequency. Colored noise may typically be expected from analog front-end circuit noise, and from system crosstalk. As mentioned previously, the resultant improvement in SNR, which may be used as a metric for BER, may be considered to be from the FFE effectively offsetting the precursor ISI to postcursor ISO, which translates to minimal noise amplification in the frequency domain. A subsequent DFE may then advantageously remove the additional ISI.

Figure 6:
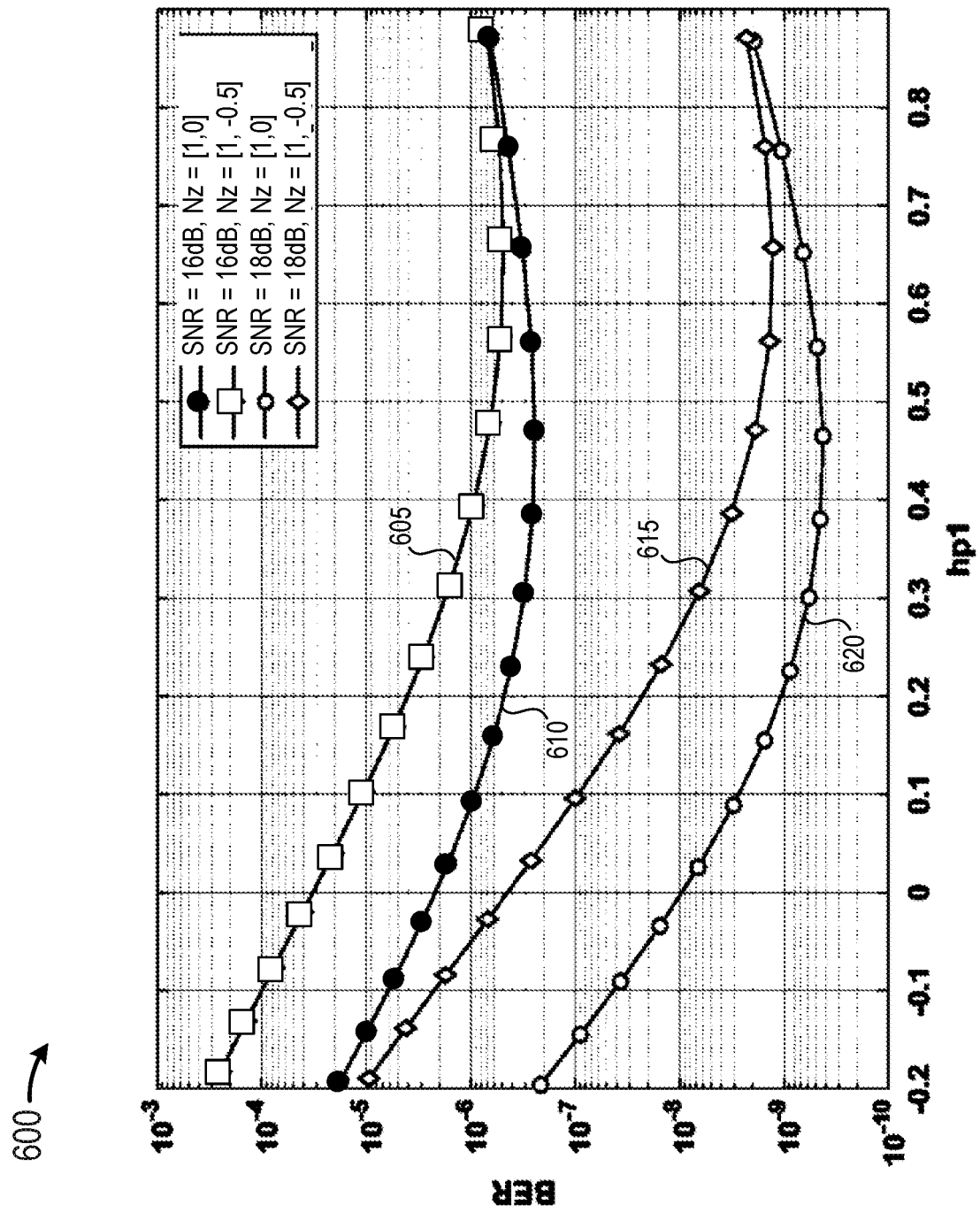
FIG. 6 depicts exemplary results of a model simulation of impact of an exemplary embodiment on system performance.

FIG. 6 depicts exemplary results of a model simulation of impact of an exemplary embodiment on system performance, using the input/output buffer information specification (IBIS) algorithmic modeling interface (AMI) modeling standard. Simulation was conducted on a long reach (high loss) channel in varied noise environments. In the simulation, $hp_1$ was predetermined and $h_1$ was adapted in a method similar to that shown in FIG. 9, in a functionally similar embodiment to the embodiment depicted in FIG. 3A and the embodiment used in the simulation for FIG. 5B. The sum of BER is graphed in plot 600 against the current value of $hp_1$ as the value of the coefficient is varied.

The results illustrate how an optimal predetermined value for $hp_1$ may depend on the link environment. For example, the overall system SNR may have an effect on the overall BER as well as the lowest BER point, as can be seen from the difference between higher SNR (16 db) series 605 and 610, and lower SNR (18 dB) series 615 and 620. A noise filter may, for example, have an impact which may be larger than that of SNR. If, for example, system noise (Nz) is colored (e.g. series 605 and 615, where Nz=[1,−0.5]), plot 600 shows that the overall BER will increase and the optimal $hp_1$ shifts to the right, as compared to non-colored noise (Nz=[1,0]) in series 610 and 620, respectively. Accordingly, stronger noise-shaping may be achieved as shown in series 605 vs series 610, and again in series 615 vs series 620. The simulation results demonstrate the ability to achieve optimized BER reduction by predetermining an optimized $hp_1$ value. Similar results may be obtained for predetermining $h_1$ and causing $hp_1$ to adapt accordingly.

Figure 7A:
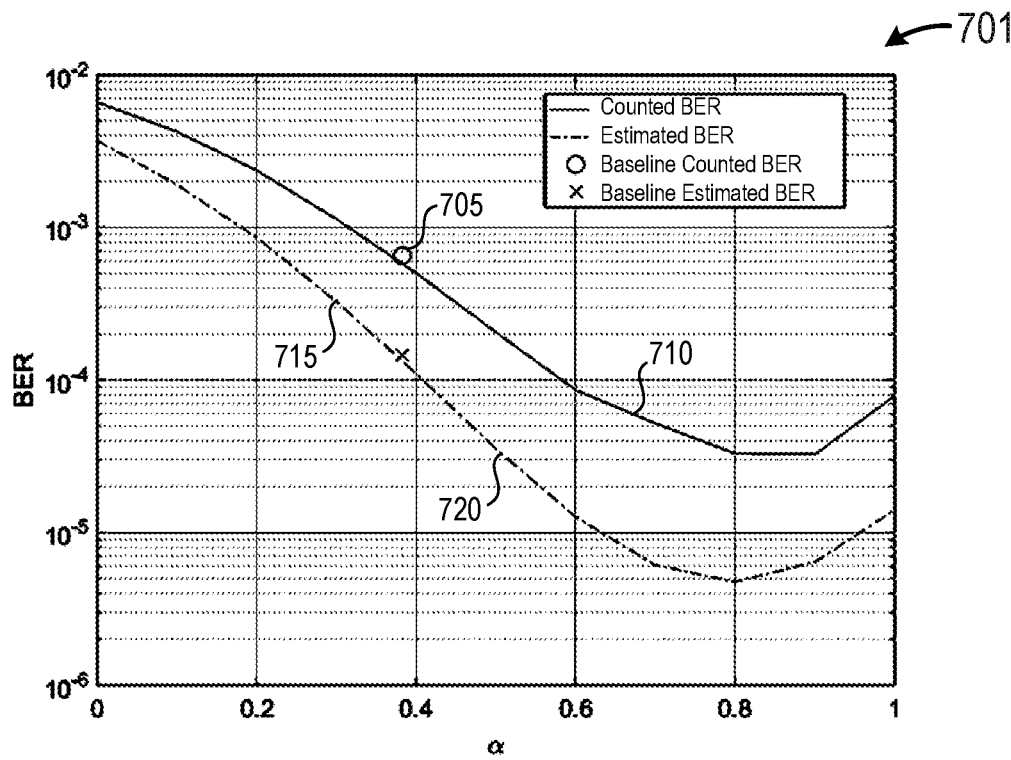
FIG. 7A depicts exemplary results of BER in an exemplary embodiment.
Figure 7B:
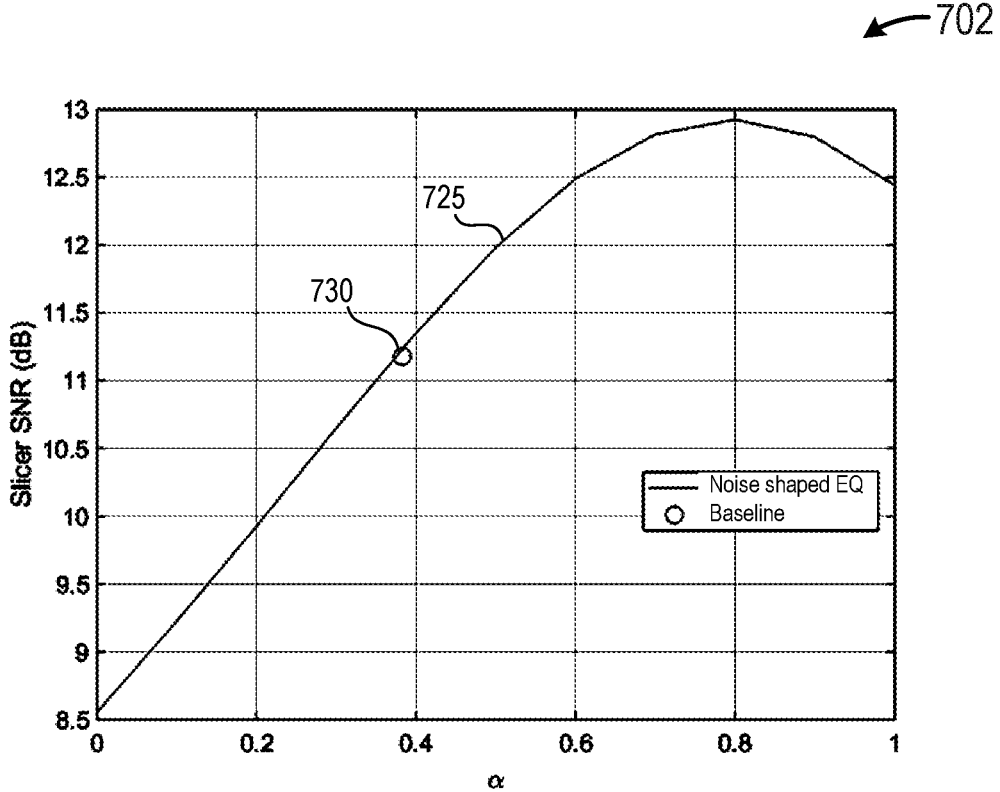
FIG. 7B depicts exemplary results of SNR in an exemplary embodiment.

FIGS. 7A and 7B depicts results of simulation comparing BER to SNR as a metric of BER with an inverse relationship. FIG. 7A shows BER results 701 in an exemplary receiver system functionally similar to that depicted in FIG. 3A, where $h_1$ is varied and $hp_1$ is predetermined. BER results 701 graphs estimated and counted BER count vs the value of coefficient α, where α correlates to $h_1$ of the DFE in FIG. 3. FIG. 7B shows SNR results 702 in the same system. SNR is graphed in dB against α, and is measured at the input to the DFE slicer. Baseline counted BER 705, baseline estimated BER 715, and baseline SNR 730 correlate to $hp_1$=0. The results show both a marked correlation between not only estimated BER 720 and counted BER 710, and a strong inverse correlation between BER and SNR 725. Furthermore, the results also indicate that finding an optimum $h_1$ (which is approximately 0.8 in the present example) may improve system performance, as measured by BER or a metric thereof.

Figure 8:
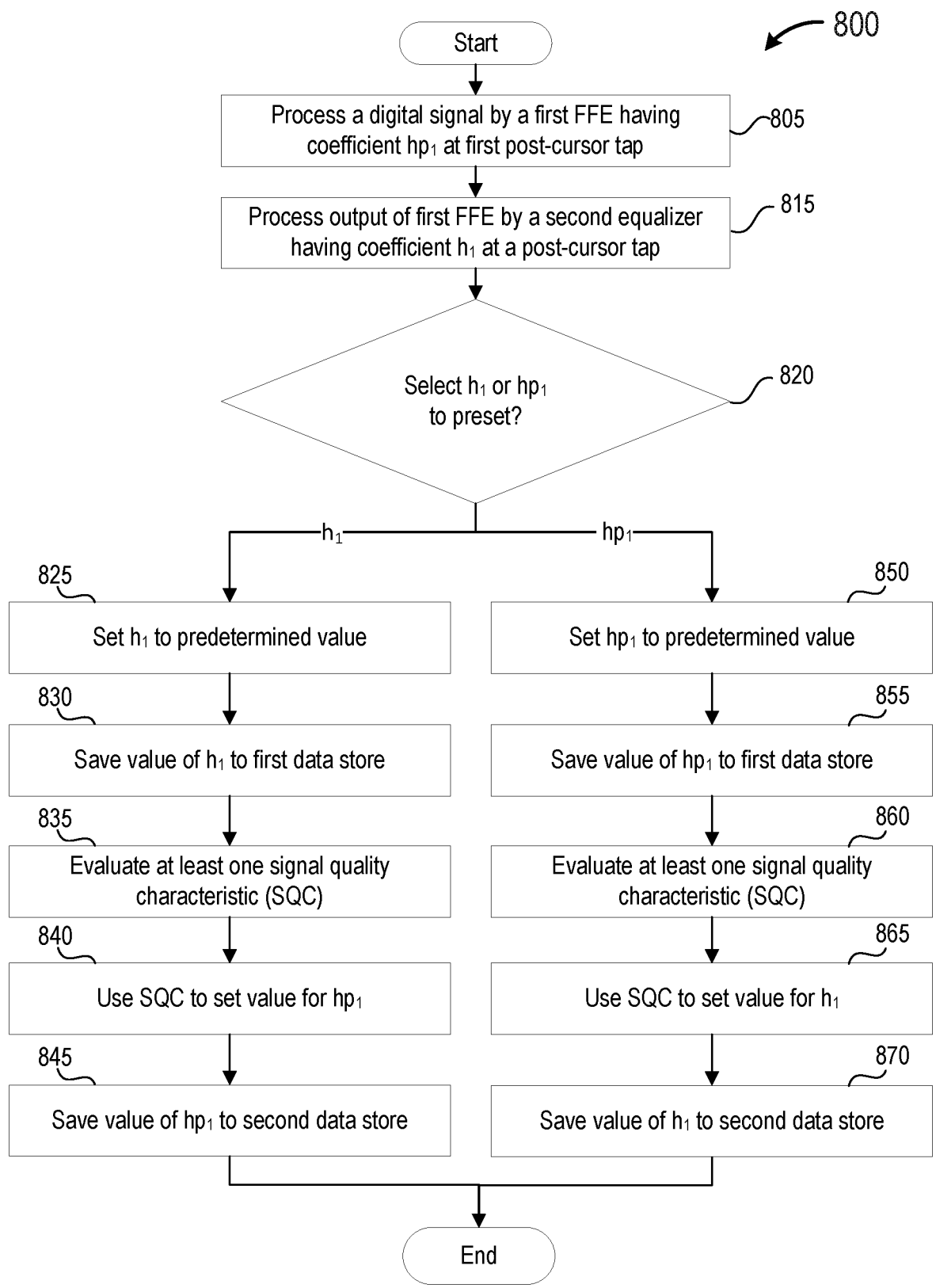
FIG. 8 depicts a flow chart of an exemplary method of adapting a coefficient $h_1$ or $hp_1$.

FIG. 8 depicts an exemplary method 800 of reducing BER in a digital signal by tuning an ADC-based receiver circuit through adaptation of a coefficient(s) of a FFE and subsequent cascade-connected DFE, examples of which are depicted in FIGS. 3A, 3B, and 4. A digital signal is processed 805 by a first FFE having coefficient hp1 at a first post-cursor tap. The first FFE may have m precursor taps ($hm_m$), and n postcursor taps ($hp_n$). The resulting output of the first FFE is processed 815 by a second equalizer having coefficient h1 at a post-cursor tap. The second equalizer may be a single or multi-tap FFE, a single or multi-tap DFE, or a plurality of equalizers. One or more additional FFEs may be operably connected between the first FFE and the second equalizer. A selection 820 is made between predetermining coefficient $h_1$ or $hp_1$, such that the unselected coefficient may be adapted to optimize the system performance by reducing BER. In various implementations, the decision on which value to preset may depend, for example, at least on the architecture. for example. With respect to the example described with reference to FIG. 3A, that embodiment may advantageously favor presetting hp1. With respect to the example described with reference to FIG. 3B, that embodiment may advantageously favor presetting h1. In some embodiments, the decision may further be a function of the CDR locking mechanism. For example, h1 may be pre-calculated based on the CDR locking criterion; in such cases, the hp1 coefficient alone may have the required degree of freedom to adapt in accordance with various examples described herein.

If $h_1$ is selected as the predetermined coefficient, presetting operations are performed on the selected coefficient. The value of $h_1$ is set 825 to a predetermined value. The predetermined value of $h_1$ is saved 830 to a first data store. The data store may be volatile memory or non-volatile memory. The predetermined value may be chosen from a lookup table, may be determined based on evaluation of one or more signal or environmental characteristics, and may be a single predetermined value. In some examples, such as those described with reference to FIG. 4, h1 may be adapted in response to an outer slower loop. If no such loop were present, some embodiments may include a recommendation look up table, which may contain values that are predetermined according to channel loss. In some examples, a higher channel loss may correspond to a higher h1 preset value.

Once presetting operations for $h_1$ are completed, the unselected coefficient $hp_1$ is adapted by performing adaptation operations. At least one signal quality characteristic (SQC) of an equalized output signal from the first FFE is evaluated 835. The results of the SQC evaluation is used to set 840 a value for $hp_1$. The set value is saved 845 to a second data store. The at least one SQC may be counted BER, estimated BER, SNR, or another metric of BER. Setting the value of $hp_1$ may comprise choosing a value from the lookup table, dynamically selecting a value using an adaptor, using an LMS adaptor, or using an iterative SNR minimization loop. The second data store may be volatile or non-volatile memory. In some embodiments, the first data store and the second data store may be identical.

Similar to steps 825-845, if $hp_1$ is selected as the predetermined coefficient, presetting operations are performed on the selected coefficient. The value of $hp_1$ is set 850 to a predetermined value. The predetermined value of $h_1$ is saved 855 to a first data store.

Once presetting operations for $h_1$ are completed, the unselected coefficient $hp_1$ is adapted by performing adaptation operations. At least one signal quality characteristic (SQC) of an equalized output signal from the first FFE is evaluated 860. The results of the SQC evaluation is used to set 865 a value for $h_1$. The set value is saved 870 to a second data store.

Figure 9:
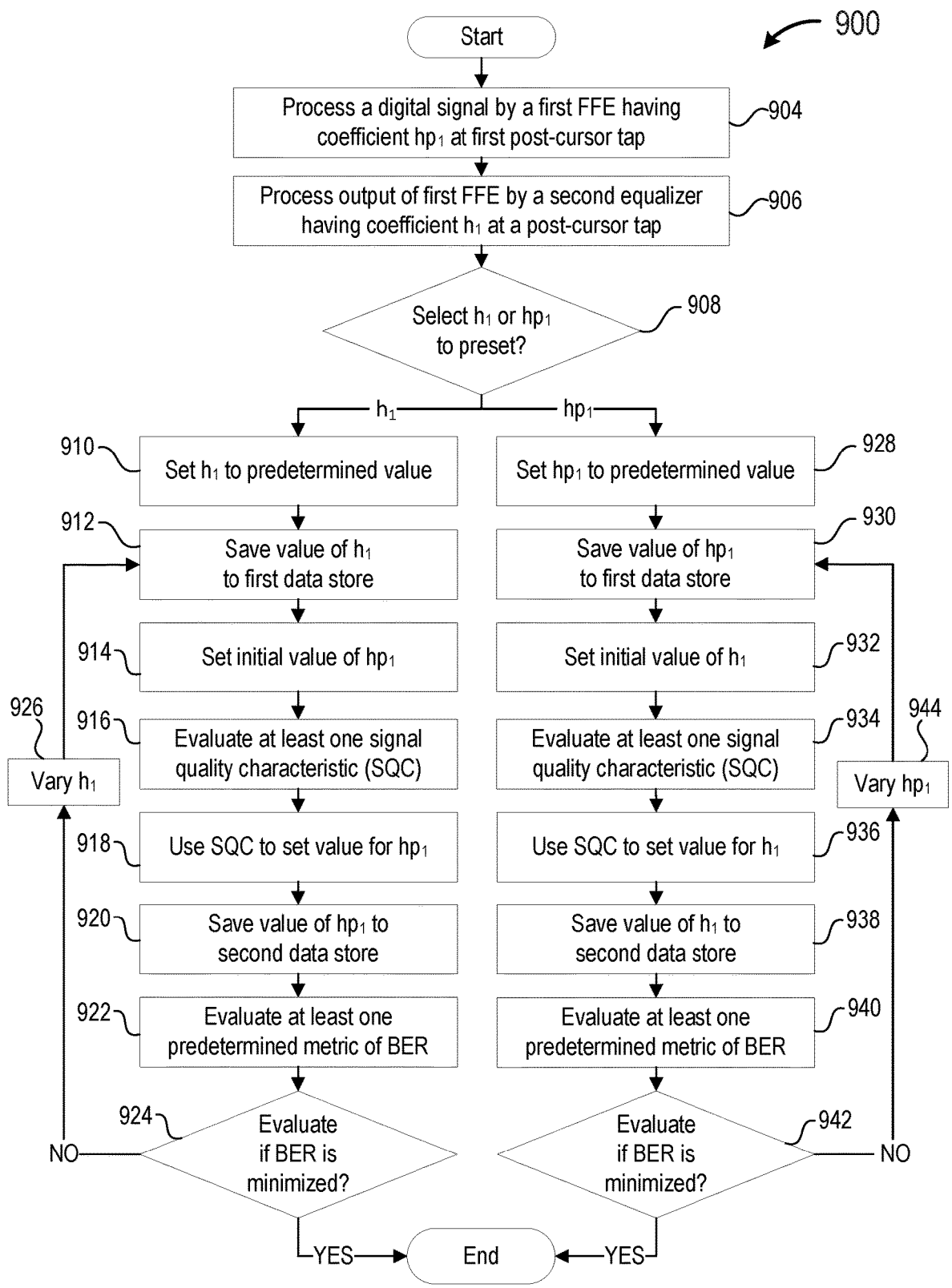
FIG. 9 depicts a flow chart of an exemplary method of iteratively adapting a coefficient $h_1$ or $hp_1$.

FIG. 9 depicts a second exemplary method 900 of reducing BER in a digital signal by adaptively tuning an ADC-based receiver circuit through adaptation of a coefficient(s) of an FFE and subsequent cascade-connected DFE, examples of which are depicted in FIGS. 3A, 3B, and 4, and similar to method 800 shown in and described in relation to FIG. 8. A digital signal is processed 904 by a first FFE having coefficient hp1 at a first post-cursor tap. The first FFE may have m precursor taps ($hm_m$), and n postcursor taps ($hp_n$). The resulting output of the first FFE is processed 906 by a second equalizer having coefficient $h_1$ at a post-cursor tap. The second equalizer may be a single or multi-tap FFE, a single or multi-tap DFE, or a plurality of equalizers. One or more additional FFEs may be operably connected between the first FFE and the second equalizer. A selection 908 is made between predetermining coefficient $h_1$ or $hp_1$, such that the unselected coefficient may be adapted to optimize the system performance by reducing BER.

If $h_1$ is selected as the predetermined coefficient, presetting operations are performed on the selected coefficient. The value of $h_1$ is set 910 to a predetermined value. The predetermined value of $h_1$ is saved 912 to a first data store. The data store may be volatile memory or non-volatile memory.

Once presetting operations for $h_1$ are completed, the unselected coefficient $hp_1$ is adapted by performing adaptation operations. An initial value of $hp_1$ is set 914. The initial value may be a predetermined value or chosen from a lookup table. In some implementations, the coefficient(s) to be adapted may be initialized to a default value (e.g., zero). At least one signal quality characteristic (SQC) is evaluated 916, and used to set 918 an adapted value for $hp_1$ and save 920 the adapted value to a second data store. At least one predetermined metric of BER is evaluated 922. The evaluation result is used to evaluate 924 whether BER is minimized. Evaluating whether BER is minimized may be performed by on-chip or off-chip circuitry, by an on-board or off-board microcontroller, by an LMS adaptation circuit, and by a circuit implementing a single or nested loop process to identify an optimum value of $hp_1$, such as by a random walk or gradient descent, wherein the change in the BER metric is determined and the direction of change therein estimated. If BER is not minimized, the current value of predetermined coefficient $h_1$ is varied 926, and steps 912-922 repeated as $hp_1$ is readapted and BER is again evaluated 924. Once BER is determined to be minimized, the optimization value is completed.

Similar to steps 910-926, if $hp_1$ is selected as the predetermined coefficient, presetting operations are performed on the selected coefficient. The value of $h_1$ is set 928 to a predetermined value. The predetermined value of $hp_1$ is saved 930 to a first data store. Once presetting operations for $hp_1$ are completed, the unselected coefficient $h_1$ is adapted by performing adaptation operations. An initial value of $h_1$ is set 932. An initial value of $h_1$ is set 932. The initial value may be a predetermined value or chosen from a lookup table. In some implementations, the coefficient(s) to be adapted may be initialized to a default value (e.g., zero). At least one signal quality characteristic (SQC) is evaluated 934, and used to set 936 an adapted value for $h_1$ and save 938 the adapted value to a second data store. At least one predetermined metric of BER is evaluated 940. The evaluation result is used to evaluate 942 whether BER is minimized. If BER is not minimized, the current value of $hp_1$ is varied 944, and steps 928-940 repeated as $h_1$ is readapted and BER is again evaluated 942. Once BER is determined to be minimized, the optimization value is completed.

Figure 10:
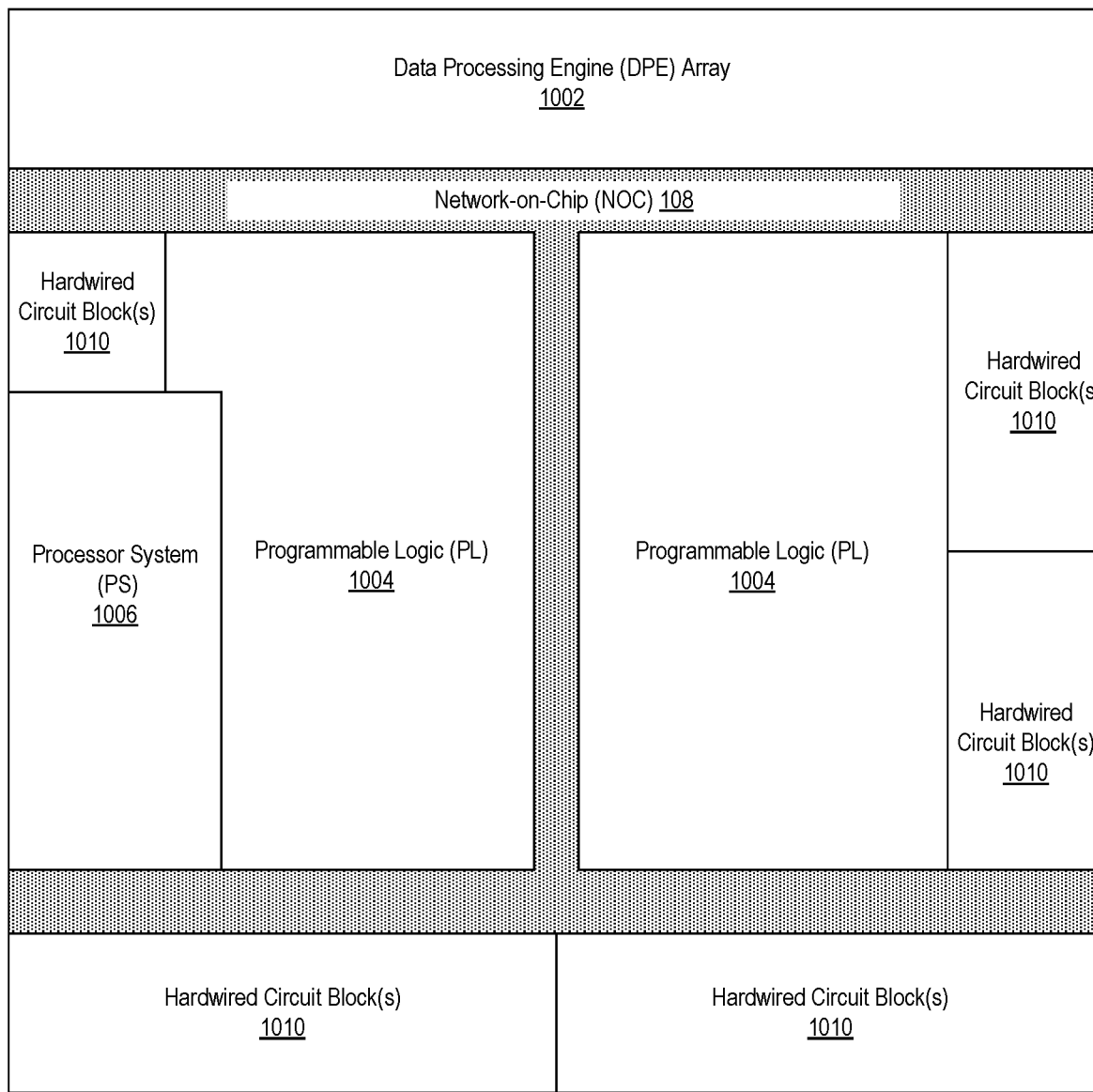
FIG. 10 illustrates an exemplary architecture for a System-on-Chip (SOC) on which the disclosed circuits and processes may be implemented.

FIG. 10 illustrates another example architecture for a System-on-Chip (SOC) on which the disclosed circuits and processes may be implemented. A SOC 1000 is an example of a programmable IC and an integrated programmable device platform. In the example of FIG. 10, the various, different subsystems or regions of the SOC 1000 illustrated may be implemented on a single die provided within a single integrated package. In other examples, the different subsystems may be implemented on two or more interconnected dies provided as a single, integrated package.

In the example, the SOC 1000 includes two or more regions having circuitry with different functionalities. In the example, the SOC 1000 optionally includes a data processing engine (DPE) array 1002. The SOC 1000 includes programmable logic (PL) regions 1004 (hereafter PL region(s) or PL), a processing system (PS) 1006, a Network-on-Chip (NOC) 1008, and one or more hardwired circuit blocks 1010. The DPE array 1002 is implemented as two or more interconnected, hardwired, and programmable processors having an interface to the other regions of the SOC 1000.

The PL 1004 is circuitry that may be programmed to perform specified functions. As an example, the PL 1004 may be implemented as field programmable gate array type of circuitry. The PL 1004 can include an array of programmable circuit blocks. Examples of programmable circuit blocks within the PL 1004 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within the PL 1004 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 1006 is implemented as hardwired circuitry that is fabricated as part of the SOC 1000. The PS 1006 may be implemented as, or include, any of a variety of different processor types each capable of executing program code. For example, the PS 1006 may be implemented as an individual processor, e.g., a single core capable of executing program code. In another example, the PS 1006 may be implemented as a multicore processor. In still another example, the PS 1006 may include one or more cores, modules, co-processors, interfaces, and/or other resources. The PS 1006 may be implemented using any of a variety of different types of architectures. Example architectures that may be used to implement the PS 1006 may include, but are not limited to, an ARM processor architecture, an x86 processor architecture, a GPU architecture, a mobile processor architecture, a DSP architecture, or other suitable architecture that is capable of executing computer-readable instructions or program code.

NOC 1008 includes an interconnecting network for sharing data between endpoint circuits in the SOC 1000. The endpoint circuits can be disposed in the DPE array 1002, the PL regions 1004, the PS 1006, and/or in the hardwired circuit blocks 1010. The NOC 1008 can include high-speed data paths with dedicated switching. In an example, the NOC 1008 includes horizontal paths, vertical paths, or both horizontal and vertical paths. The arrangement and number of regions shown in FIG. 10 is merely an example. The NOC 1008 is an example of the common infrastructure that is available within the SOC 1000 to connect selected components and/or subsystems.

The NOC 1008 provides connectivity to the PL 1004, the PS 1006, and to selected ones of the hardwired circuit blocks 1010. The NOC 1008 is programmable. In the case of a programmable NOC used with other programmable circuitry, the nets that are to be routed through the NOC 1008 are unknown until a user circuit design is created for implementation within the SOC 1000. The NOC 1008 may be programmed by loading configuration data into internal configuration registers that define how elements within the NOC 1008 such as switches and interfaces are configured and operate to pass data from switch to switch and among the NOC interfaces.

The NOC 1008 is fabricated as part of the SOC 1000 and while not physically modifiable, may be programmed to establish connectivity between different master circuits and different slave circuits of a user circuit design. The NOC 1008, for example, may include two or more programmable switches that are capable of establishing packet switched network connecting user specified master circuits and slave circuits. In this regard, the NOC 1008 is capable of adapting to different circuit designs, where each different circuit design has different combinations of master circuits and slave circuits implemented at different locations in the SOC 1000 that may be coupled by the NOC 1008. The NOC 1008 may be programmed to route data, e.g., application data and/or configuration data, among the master and slave circuits of the user circuit design. For example, the NOC 1008 may be programmed to couple different user-specified circuitry implemented within the PL 1004 with the PS 1006, and/or the DPE array 1002, with different hardwired circuit blocks, and/or with different circuits and/or systems external to the SOC 1000.

The hardwired circuit blocks 1010 may include input/output (I/O) blocks, and/or transceivers for sending and receiving signals to circuits and/or systems external to the SOC 1000, memory controllers, or the like. Examples of different I/O blocks may include single-ended and pseudo differential I/Os and high-speed differentially clocked transceivers. Further, the hardwired circuit blocks 1010 may be implemented to perform specific functions. Examples of the hardwired circuit blocks 1010 include, but are not limited to, cryptographic engines, digital-to-analog converters, analog-to-digital converters, and the like. The hardwired circuit blocks 1010 within the SOC 1000 may be referred to herein from time-to-time as application-specific blocks.

In the example of FIG. 10, the PL 1004 is shown in two separate regions. In another example, the PL 1004 may be implemented as a unified region of programmable circuitry. In still another example, the PL 1004 may be implemented as more than two different regions of programmable circuitry. The particular organization of the PL 1004 is not intended as a limitation. In this regard, the SOC 1000 includes one or more PL regions 1004, the PS 1006, and the NOC 1008. The DPE array 1002 may be optionally included.

In other example implementations, the SOC 1000 may include two or more DPE arrays 1002 located in different regions of the IC. In still other examples, the SOC 1000 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, a predetermined coefficient ($h_1$ or $hp_1$) may act as a parameter that sets an amount of noise boosting counteraction. The entire FFE filter, as a whole, may provide the noise shaping, but the predetermined coefficient may be advantageously adjusted to bias the FFE filter towards a desired noise shaping characteristic. In some embodiments, an FFE filter may comprise a plurality of FFEs, a DFE, or some combination thereof. The predetermined coefficient (e.g., the selected coefficient of $h_1$ or $hp_1$ to predetermine) may be the coefficient primarily determining a trade-off between ISI and noise. The adapted coefficient(s) (e.g., the unselected coefficient of $h_1$ or $hp_1$) may be adapted to converge on a best possible value (e.g., according to one or more SQCs) given the current value of the predetermined coefficient. In some embodiments, for example, the predetermined coefficient may act as a bias for the FFE filter, and the adaptive coefficient(s) may be adapted to equalize, given the predetermined bias. Accordingly, a 'bias' value may be advantageously chosen to optimize BER by balancing ISI and noise.

For example, various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

In some embodiments, an ADC based receiver circuit with two cascaded FFEs, which may be referred to as a 'back-to-back' FFE (B2BFFE) circuit, an example of which is depicted by FIG. 3B, may comprise a first FFE to fully equalize the channel first. A CDR loop (not shown in FIG. 3B) may use output data and errors of the first FFE, thereby complete decoupling the CDR loop from $h_1$. Evaluation of the front FFE coefficients may be advantageously used to select a locking point position for tuning a CDR coefficient.

A second FFE may be provided in a cascade connection following the first FFE and configured for pulse shaping or noise shaping, and may be referred to as a "back FFE." The back FFE may have a coefficient $1+(h_1+\varepsilon)D$, where $\varepsilon$ is an offsetting coefficient which allows $h_1$ to be advantageously applied to both the DFE and FFE. The back FFE may be followed in a cascade connection by a DFE and slicers. The DFE may have coefficient $1+h_1D$. These DFE and back FFE coefficients may be adjusted to optimize the response of the $1+h_1D$ DFE, and may be particularly adapted with DFE data and errors. The combination of a back FFE and DFE where the back FFE is provided with an adaptable coefficient mathematically linked with the DFE, may be advantageously used to eliminate high frequency noise and postcursor ISI increased by the front FFE. In some embodiments, the coefficient $h_1$ of the DFE and back FFE may be fixed and the first postcursor coefficient $hp_1$ of the front FFE adapts, or $hp_1$ may be fixed and $h_1$ adapts.

Some embodiments of an ADC based receiver circuit may comprise some slicers capable of flexible utilization. For example, on startup some slicers may be used for frequency detection (FD). The circuit may be configured to reappropriate the slicers during "mission mode" (vs. test mode or startup mode) for use in SNR estimate. In some embodiments, reappropriation of the slicers may be controlled by an on-board or off-board processor. For example, in a B2BFFE configured circuit, the spare slicers may be connected and configured to receive data output from either the front FFE or back FFE, and may be further connected and configured to output at least one signal to an adaptation circuit.

In some example embodiments, a CDR locking point may be configured to lock based on coefficients associated with some portion of a receiver circuit. For example, in some noise-shaping FFE embodiments, an exemplary embodiment of which is shown in FIG. 3A, a correlator-based inner loop in a microcontroller may be configured and connected to determine the CDR locking point. In some such embodiments, there may be no additional implementation or performance cost, because FD slicers may be reused for determining the CDR locking point. In some B2BFFE embodiments, an exemplary embodiment of which is shown in FIG. 3B, the locking point may be determined based off at least one coefficient of the front FFE, by correlator circuit, or some combination thereof. In some such embodiments, there may be minimal implementation or performance cost related to employment of slicers and to calculating additional small coefficients for the additional FFE.

In some example embodiments, a ratio between a first postcursor tap coefficient $hp_1$ of a first FFE, and a tap coefficient $h_1$ of a DFE is maintained. For example, $h_1$ and $hp_1$ may be co-adapted by determining a ratio therebetween. A $h_1:hp_1$ ratio may be selected from a lookup table, may be determined using an adaptation circuit, and may be determined using at least one loop in an on-chip or off-chip microcontroller. In some embodiments, an initial value of either $h_1$ or $hp_1$ may be selected, together with a ratio of $h_1:hp_1$. In some such embodiments the ratio may be subsequently adapted, such as according to a random walk or gradient descent process while evaluating a metric of BER. In some such embodiments the value of $h_1$ or $hp_1$ may be further adapted based on at least one SQC, and the other value of $h_1$ or $hp_1$ subsequently adjusted to maintain the ratio. Adaptation of coefficients using a h-;$hp_1$ ratio may reduce adaptation time or implementation cost in embodiments optimizing system performance by tuning one or more FFE and DFE coefficients, for example, by providing initial value(s) of a coefficient that may be relatively close to an optimized value, or by reducing or eliminating further adaptation of one or more coefficients.

In some example embodiments, a value for coefficients h1, $hp_1$, a ratio therebetween, or a combination thereof may be selected from at least one lookup table. For example, a lookup table may be stored in a data store which may be on-chip or off-chip. A coefficient value may be selected based on at least one SQC. The SQC may be, for example, channel loss, crosstalk level, and noise PSD. Some implementations may use a lookup to provide an initial value for one or more coefficients before performing further adaptation. Embodiments using a lookup table may help reduce adaptation time or implementation cost in a receiver circuit configured to optimize system performance by tuning a first FFE or DFE coefficient(s).

In some example embodiments provided with an adaptation circuit controlled by a loop to optimize system performance by varying the adapted coefficient, at least two levels of adaptation may be performed. For example, an initial sweep of values of the coefficient being varied may be conducted in increments across a first range to find an initial value that initially optimizes a SQC being monitored. A second, finer sweep of values may then be performed in smaller increments across a second, smaller range. The second range may be selected using a predetermined offset from the initial value. The predetermined offset may be above the initial value, below the initial value, or both. Embodiments providing multi-level adaptation in a receiver circuit adapting one or more FFE or DFE coefficient to optimize system performance may increase system performance by finding a more optimized follow, and may decrease adaptation time by reducing the number of increments required to reach an optimized value.

Some embodiments may relate to an ADC-based digital receiver including a feedforward equalizer (FFE) that has m precursor taps and n postcursor taps and is adapted to equalize the precursor portion, and various embodiments are further configured to adapt postcursor intersymbol interference (ISI) through a predetermined equalization coefficient (e.g., $hp_1$) in order to counteract the noise boosting effect associated with the precursor equalization. In an illustrative example, the receiver may optimize bit error rate (BER) by dynamically balancing noise and ISI through adaptively determining a coefficient $hp_1$ of a first postcursor tap of a first feed forward equalizer (FFE) and a coefficient $h_1$ of a first postcursor tap of a second equalizer operably connected to an output of the first FFE. The first FFE may optimize ISI removal and noise reduction by, for example, trading off precursor ISI and postcursor ISI. The second equalizer may include a decision feedback equalizer (DFE) and slicers adapted to substantially reduce or eliminate additional ISI introduced by the first FFE. One coefficient of $h_1$ and $hp_1$ is selected to be predetermined, and the unselected coefficient is adapted to minimize a metric of BER. In some embodiments, one of $h_1$ or $hp_1$ may be iteratively adapted to minimize BER, as measured by an SNR estimator, for example.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A receiver calibration circuit comprising:
a processor; and
a data store coupled to the processor and containing a program of instructions that, when executed by the processor, cause operations to be performed to calibrate coefficients for taps of a plurality of cascade-connected digital equalizers, the operations comprising:
processing a digital signal by a first forward feedback equalizer (FFE) provided with m precursor taps, n postcursor taps, and a coefficient $hp_1$ at a first postcursor tap, wherein m and n are non-zero positive integers;
processing an output of the first FFE by a second equalizer having a coefficient $h_1$ at a post-cursor tap of the second equalizer to generate an equalized output signal;
presetting one coefficient selected from $hp_1$ and $h_1$;
adapting an unselected coefficient from $hp_1$ and $h_1$ according to at least one signal quality characteristic of the equalized output signal.

2. The circuit of claim 1, further comprising an analog to digital converter (ADC) configured to receive an analog signal and produce the digital signal therefrom.

3. The circuit of claim 1, wherein presetting one coefficient comprises:
selecting one coefficient from $hp_1$ and $h_1$ to preset;
setting the selected coefficient to a predetermined value; and
saving the value of the selected coefficient in a data store.

4. The circuit of claim 1, wherein adapting the unselected coefficient comprises:
evaluating the at least one signal quality characteristic of the equalized output signal;
using the at least one signal quality characteristic to set a value for the unselected coefficient; and
saving the value of the unselected coefficient in a data store.

5. The circuit of claim 1, wherein:
the second equalizer comprises a decision feedback equalizer (DFE) provided with a first postcursor tap having the coefficient $h_1$ thereat, and
the at least one signal quality characteristic comprises a measure of signal-to-noise ratio (SNR) as a metric of Bit Error Rate (BER).

6. A method to reduce bit error rate (BER) in a digital signal by dynamically balancing received signal noise and intersymbol interference (ISI), the method comprising:
processing a digital signal by a first forward feedback equalizer (FFE) provided with m pre-cursor taps, n post-cursor taps, and a coefficient $hp_1$ at a first post-cursor tap, wherein m and n are non-zero positive integers;
processing an output of the first FFE by a second equalizer having a coefficient $h_1$ at a post-cursor tap to generate an equalized output signal;
presetting one coefficient selected from $hp_1$ and $h_1$; and
adapting an unselected coefficient from $hp_1$ and $h_1$ according to at least one signal quality characteristic of the equalized output signal.

7. The method of claim 6 wherein presetting one coefficient comprises:
selecting one coefficient from $hp_1$ and $h_1$ to be preset;
setting the selected coefficient to a predetermined value; and
saving the value of the selected coefficient in a first data store.

8. The method of claim 7 wherein adapting an unselected coefficient comprises:
evaluating the at least one signal quality characteristic of the equalized output signal;
using the at least one characteristic to set a value for the unselected coefficient; and
saving the value of the unselected coefficient in a second data store.

9. The method of claim 8, wherein setting a value for the unselected coefficient comprises selecting a value from a lookup table based on a measured value of the at least one characteristic.

10. The method of claim 9, wherein the value is selected from the lookup table is also selected based on a ratio between $h_1$ and $hp_1$.

11. The method of claim 6 wherein the second equalizer comprises a decision feedback equalizer (DFE).

12. The method of claim 11, wherein:
the second equalizer further comprises a second FFE connected in cascade between the first FFE and the DFE,
the second FFE is provided with a single postcursor tap having the coefficient $h_1$ thereat, and
the DFE is provided with at least one postcursor tap having the coefficient $h_1$ thereat.

13. The method of claim 6, wherein additional coefficients of the first FFE taps comprise precursor taps $hm_m$, $hm_{m+1}, \ldots hm_1$ and postcursor taps other than the first postcursor tap $hp_2 \ldots hp_n$; and the method further comprises adapting the additional coefficients.

14. The method of claim 13, wherein the additional adaptation operations comprise a least mean squares (LMS) coefficient adaptation method.

15. The method of claim 8, wherein the first data store and the second data store are disposed on a single data storage device.

16. The method of claim 6, wherein the selected coefficient is $h_1$.

17. The method of claim 6, wherein the selected coefficient is $hp_1$.

18. The method of claim 6, further comprising performing iterative adaptation of the selected coefficient, the iterative adaptation operations comprising:

evaluating at least one predetermined metric of BER, evaluating if BER is minimized using the predetermined metric, varying the current value of the selected coefficient, saving the current value of the selected coefficient in a first data store, and repeating the adapting operations on the unselected coefficient.

19. The method of claim 18, wherein:

at least some of the adaptation operations are controlled by a microcontroller, and the predetermined metric of BER comprises signal-to-noise ratio (SNR) measured by an SNR estimator.

20. The method of claim 6, wherein the signal quality characteristic comprises signal-to-noise ratio (SNR) measured at an output of the second equalizer.

* * * * *